June 30, 1964 R. K. YORK 3,139,536
LOW LEVEL TRANSISTOR GATING CIRCUIT
Filed Nov. 29, 1961
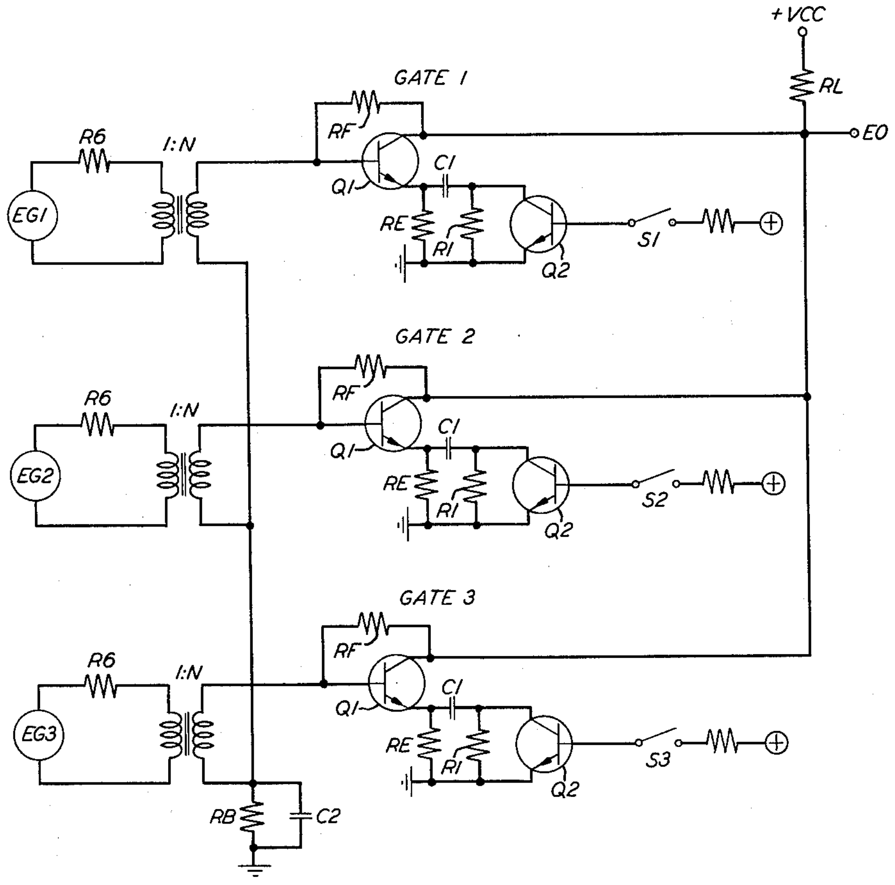
INVENTOR
R. K. YORK
BY S E Hollander
ATTORNEY 3,139,536
Patented June 30, 1964

3,139,536

LOW LEVEL TRANSISTOR GATING CIRCUIT

Robert K. York, New Brunswick, N.J., assignor to Bell Telephone Laboratories, Incorporated, New York, N.Y., a corporation of New York Filed Nov. 29, 1961, Ser. No. 155,780
5 Claims. (Cl. 307—88.5)

This invention relates to gating circuits and more particularly to low level transistor gating circuits arranged to introduce minimal transient or spurious switching noise into the signal being gated.

A continuing problem in the developing of gating circuits relates to the difficulties presented in applications where it is necessary to switch or gate very low level signals. Although the immediate obstacle which presents itself relates to the almost inevitable transient disturbance produced by any switching operation, the threat presented by spurious and undesired signals is most acute in efforts to switch extremely low level signals. In part, this is due to the fact that the introduction of transient signals into a system wherein the legitimate signal is of very low level often provides an output from the gating arrangement which is objectionable due to a low signal-to-noise ratio.

Unfortunately, in low level switching, a low signal-to-noise ratio may exist even though the gating system is relatively efficient in eliminating or preventing transient phenomena. This results since the transient signal, although perhaps of unusually low intensity, is nevertheless significant, at least relatively, since the legitimate signal is also of very low intensity.

In the past it has been sought to overcome these difficulties in various ways which included the use of extra stages of amplification of the low level signal prior to introduction to the gating equipment and also the use of sophisticated (and costly) structures for preventing or eliminating switching transients.

In some aspects, the inefficiencies which reside in prior attempts to resolve the problem and also the fact that in some measure these attempts have been merely palliative rather than remedial are attributable to the relatively prosaic design switching philosophy employed.

In short, certain prior solutions in this area have been dictated by the traditional necessity in switching requirements to provide the classical two-state condition of the switch or gate, i.e., the switch is either as fully "off" as possible or as fully "on" as possible. The difficulty which attaches to using these criteria as a guide results from the fact that switching, per se, dictates the necessity of frequent translations of the gate between the fully "off" and fully "on" condition.

In view of the design approach in which the two conditions of the gate are viewed as wholly foreign to each other—to the extent that painstaking efforts are directed to electrically divorcing the two conditions—it is not surprising that the switch or gate behaves electrically in a radically different fashion at each extreme. In part, this is due in the case of a transistor amplifier to the abrupt change in the direct-current point of operation during gating.

It is therefore an object of this invention to provide a low level gating circuit arranged to minimize transient or spurious signal introduction during the gating process.

Still another object of this invention is to provide a low level transistor gating circuit in which the direct-current point of operation remains unchanged during the gating process.

Still another object of this invention is to provide an arrangement for operating a transistor gating circuit in which the amplifier is provided with zero voltage gain in the "off" condition of the switch and with normal voltage gain during the "on" condition of the switch.

These and other objects of the invention are achieved in an illustrative embodiment in which a low level gate utilizes two transistors. In the "off" condition of the gate, the first transistor operates as a linear amplifier although (as shown herein) with a zero voltage gain, and the second transistor is biased into the nonconducting condition. In order to energize the gate, the second transistor is driven into saturation thereby providing a low impedance alternating current path (through a capacitor) across an emitter-resistor of the first transistor. As will be demonstrated in detail herein, the alteration in alternating-current impedance by shunting the emitter-resistor of the first transistor serves to modify the gain of the first transistor and in effect permits it (the first transistor) to function as a common emitter amplifier. Significantly, in view of the purposes to which the gate is directed and the obvious difficulties attendant on changing the direct-current biasing of a low level gating circuit, all of the above switching operations are performed without varying the direct-current biasing of the first transistor. An immediate advantage of this arrangement is the elimination of any transient disturbances which would have arisen in consequence of variations in the direct-current biasing. As a result, the two-transistor gate functions effectively to admit (or impede) extremely low level signals without the usual transient interference which arises as a result of the gating, per se, and which in the case of such low intensity signals could actually mask or distort the signal sought to be gated.

This operating arrangement is available as a result of a departure in the procedure employed in attacking the problem of gating extremely low level signals. In lieu of the approach often taken in which a transistor gate in the "off" condition is literally "off," or in a high impedance condition such that a marked change in the direct-current operating potentials is required to open the gate, the present arrangement will not block an input signal in consequence of the gate amplifier being literally "off" but instead will balance any input signal which appears through the first transistor by another signal which is out of phase and substantially equal in magnitude. In short, by making a feedback resistor from the collector to the base of the first transistor substantially equal in impedance to an emitter-resistor of the first transistor, any output signal which appears at the output of the transistor is balanced. This is apparent since the output signal may be considered to include two components. The first appears in phase with the input signal and is transmitted through the feedback resistor to the ouput. The second is transmitted through the transistor and as a result appears out of phase with the input signal. It will be demonstrated herein that as a result of making the feedback resistor and emitter-resistor substantially equal that these components will neutralize each other.

In short, the problems which arise by abrupt transitions from gate-on to gate-off are obviated by not literally driving the first gate transistor to the "off" condition. Instead, the gate remains "on" and the gain is varied from substantially zero to a predetermined value.

A feature of this invention includes a transistor gate in which a transistor is biased in the amplification region during the "off" condition of the gate.

An additional feature of this invention includes facilities for energizing a transistor gate without disturbing the direct-current operating bias or potentials.

A further feature of this invention includes facilities for changing the alternating-current impedance of the emitter circuit of the transistor gate to enable switching.

Another feature of this invention includes means for producing potentials which oppose those transmitted through the gate during the "off" condition thereof.

These and other objects and features of the invention may be more readily apprehended from an examination of the following specification and attached drawing in which the single figure shows a series of gates embodying the present invention in an environment suitable for use at the output circuitry of a memory store.

It may be assumed for illustrative purposes that the three signal generators, $E_{G1}$, $E_{G2}$ and $E_{G3}$, symbolically represent the generation of extremely low level output signals from a memory store which may be interrogated as required. It is well known that certain memory stores including permanent magnet memory facilities provide an output upon interrogation that may be as low as one millivolt for the "1" signal.

A particular signal gate, for example gate 1, includes two transistors, Q1 and Q2. An emitter-resistor $R_E$ is in shunt with capacitor $C_1$, resistor $R_1$, and the collector-emitter path of transistor Q2. During all times, transistor Q1 is biased in the linear region by resistors $R_F$, $R_B$, $R_L$, and $R_E$. The transformer coupling between the signaling generators $E_{G1}$–$E_{G3}$ and the respective gating transistors is, of course, illustrative and may take other well-known forms but provides for the possibility of amplifying the input signal before it reaches the transistor gates. Transistor Q2 is normally in the "off" condition. Under these circumstances the voltage gain of the gate is given by the relationship:

$$\frac{E_O}{E_G}=\frac{nR_L(hib'-R_F)}{n^2R_6\left(hib'+\frac{R_F}{\beta}+R_L\right)+hib'(R_F+R_L)}$$

where $$hib'=hib+R_E\beta\gg 1$$

wherein:

$E_O$ is equal to the output voltage of the gate,
$E_G$ is equal to the output voltage of the memory,
$n$ is the transformer turns ratio,
$R_L$ is the resistance of the load,
$hib$ is the small signal input impedance of a grounded base transistor-amplifier,
$R_F$ is the feedback resistance from collector to base of transistor Q1.
$R6$ is the internal impedance of the memory,
$\beta$ is the current gain of the transistor Q1 when operating as a grounded emitter amplifier, and
$R_E$ is equal to the emitter-resistor of transistor Q1.

It will be seen from the above relationship that the numerator is substantially equal to zero. Conventionally the small signal input impedance of a grounded base transistor amplifier is sufficiently small to be neglected in comparison to the emitter-resistance $R_E$ as shown herein in the list of parameter values. This leaves, in the parenthetical expression of the numerator, $R_E-R_F$. Since the latter two resistances have been designed to be equal, their difference is equal to zero and as a result the gain of the transistor or ratio $E_O$ to $E_G$ is equal to zero even through the transistor is in the linear amplifying region.

Physically the zero gain of the gate may be visualized by considering that the output signal from transistor Q1 is, in fact, a resultant of two distinct signals. A first signal appears in phase with the input signal from the memory and travels through feedback resistor $R_F$. The second signal is inverted from the input signal in traveling through transistor Q1. These two signals are designed to neutralize each other.

*Description of Operation*

It will be assumed for illustrative purposes that it is desired to energize gate 1. In order to do so, switch $S_1$ connected to the base electrode of transistor Q2 in gate 1 is closed thereby saturating transistor Q2. Since transistor Q2 is in shunt with resistance $R_1$ and resistance $R_E$, the effective alternating current impedance in the emitter circuit of transistor Q1 is materially varied, and since transistor Q2 presents a substantially short-circuit impedance (in saturation), the emitter-resistance $R_E$ is in effect bypassed through capacitor $C_1$ and the collector-emitter path of transistor Q2.

It will be seen that at the time transistor Q2 is energized, the voltage across capacitor $C_1$ is substantially equal to the voltage across resistance $R_E$. In consequence, the only transient generated is the relatively small one that obtains when transistor Q2 is switched on and thereafter reflected through capacitor $C_1$ and the emitter-collector path of transistor Q1. It should be noted in this respect that since the gate transistor Q2 has no collector supply, it acts as a switch with a relatively small change in collector current. Moreover, it is apparent that the direct-current point of operation of the transistor is not varied during the gating and that the minimal gate transient adverted to above is introduced after the signal itself has passed through the amplifying stage in transistor Q1.

In short, gate 1 will deliver a signal indicative of the then existing output signal from symbolic generator $E_{G1}$ indicating the output of the memory circuit, whereas none of the other gates will deliver any signal since the corresponding transistor Q1 in the remaining gates maintain a zero voltage gain. This precludes any output from the remaining gates 2 and 3 as a result of the output from generator $E_{G1}$ or generators $E_{G2}$ and $E_{G3}$. The remaining gates may be activated by saturating the respective transistor Q2 in the manner described above for gate 1 and corresponding analyses may be made.

It is significant to observe that the minimal transient introduced in the gating operation as described above is wholly different in character and order of magnitude from that introduced in conventional gating arrangements in which the transistor is driven from a direct-current biasing condition representing the "off" state of the transistor to a significantly different direct-current point of operation indicative of the "on" state of the transistor. Thus, in comparison, the voltage excursion between operating points in conventional gates where the direct-current point of operation is changed may perhaps be in the order of volts whereas the voltage transient introduced through the operation of gate 1 as a result of current flow through the base electrode of gate 1 may be in the order of millivolts. The resultant advantages in detecting signals from generator $E_{G1}$, which itself may, be in the order of millivolts, is manifest since in the case of a conventional gate, the resultant transient may completely mask the legitimate signal whereas in the present arrangement the resultant transient is a fraction of the legitimate signal.

In order to disable the gate, switch $S_1$ is merely opened to restore transistor Q2 to its high impedance condition thereby altering the gain of transistor Q1 to zero as explained above.

The parameters in the figure may advantageously take the following illustrative values:

$R_F$=3,160 ohms
$R_E$=3,160 ohms
$R_1$=121,000 ohms
$R_L$=1,000 ohms
$R_B$=3,830 ohms
$C_1$=0.005 microfarad
$C_2$=4 microfarads
transistor Q1=2N560
transistor Q2=2N560

It is understood that the above described arrangement is merely illustrative and that various modifications may be made by those skilled in the art without departing from the spirit and scope of the invention.

What is claimed is:

1. A low level transistor gating circuit including a first transistor and a second transistor means, first impedance means connected to said first transistor means, second impedance means coupling said first and second transistor means, means for biasing said first transistor means in the linear amplifying region, input signal means connected to said first transistor means, said first transistor means being responsive to the energization of said input signal means to produce mutually opposing output signals, the resultant output of said signals being substantially zero, and additional means for energizing said second transistor means to bypass said second impedance means, said first transistor means being responsive thereafter to the energization of said input signal means to produce an output signal proportional to the signal delivered by said input signal means.

2. A gating circuit for switching extremely low level signals including a first transistor and a second transistor having base, emitter and collector electrodes, feedback impedance means coupling said base and collector electrodes of said first transistor, emitter impedance means substantially equal to said feedback impedance means coupled to said emitter electrode of said first transistor, capacitor means coupling said emitter electrode of said first transistor to said collector electrode of said second transistor, means for biasing said first transistor in the linear amplification region for zero gain, a plurality of signal sources, and means coupled to said base and emitter electrodes of said second transistor for energizing said second transistor to shunt alternating-current signals from said emitter impedance means of said first transistor to increase the gain of said first transistor from zero to a higher value in a discrete step to gate a signal from a selected one of said sources without varying the direct-current operating point of said first transistor.

3. A gating circuit for switching extremely low level signals including a first transistor and a second transistor having base, emitter and collector electrodes, feedback impedance means coupling said collector and base electrodes of said first transistor, emitter impedance means coupled to said emitter electrode of said first transistor, capacitor means coupling said emitter electrode of said first transistor to said collector electrode of said second transistor, input signal means, transformer means coupling said input signal means to said base electrode of said first transistor, output means coupled to said collector electrode of said first transistor, means for biasing said first transistor for producing zero gain in the linear amplification region according to the relationship:

$$\frac{E_O}{E_G}=\frac{nR_L(hib'-R_F)}{n^2R_g\left(hib'+\frac{R_F}{\beta}+R_L\right)+hib'(R_F+R_L)}$$

where $$hib'=hib+R_E\beta\gg 1$$

wherein:

$E_O$ is the voltage produced in said output means,
$E_G$ is the voltage produced by said signal input means,
$n$ is the transformer turns ratio,
$R_L$ is the resistance of said output means,
$hib$ is the small signal input impedance of a grounded base transistor amplifier,
$R_F$ is said feedback impedance means,
$R_g$ is the impedance of said input signal means,
$\beta$ is the current gain of said first transistor, and
$R_E$ is the resistance of said emitter impedance means, said feedback impedance means being substantially equal to said emitter impedance means, and additional means coupled to said base and emitter electrodes of said second transistor for energizing said second transistor to shunt input signals from said emitter impedance means to increase the gain of said first transistor from zero to a higher level in a single discrete step without modifying the direct-current biasing of said first transistor.

4. A gating circuit for extremely low level signals including a first transistor and a second transistor having base, emitter and collector electrodes, input signal means coupled to said base electrode of said first transistor, output means coupled to said collector electrode of said first transistor, feedback impedance means coupling said collector and base electrodes of said first transistor, a source of reference potential, emitter impedance means coupling said emitter electrode of said first transistor to said source of reference potential, capacitor means coupling said emitter electrode of said first transistor to said collector electrode of said second transistor, additional impedance means coupling said collector electrode of said second transistor to said emitter electrode of said second transistor, said additional impedance means being substantially higher in magnitude than said emitter impedance means, said feedback impedance means being substantially equal to said emitter impedance means, means for direct-current biasing said first transistor including said feedback impedance means and said emitter impedance means for zero gain in the linear amplifying region, and additional means coupled to said base and emitter electrodes of said second transistor for energizing said second transistor to shunt alternating-current signals from said emitter impedance means of said first transistor to increase the gain of said first transistor from zero to a higher level in a single discrete step without varying the direct-current biasing of said first transistor.

5. A transistor gating circuit for switching extremely low level signals including a first transistor and a second transistor having base, emitter and collector electrodes, feedback impedance means coupling said collector and base electrodes of said first transistor, emitter impedance means connected to said emitter electrode of said first transistor, said feedback impedance means and emitter impedance means being substantially equal in magnitude, means including both of said impedance means for biasing said first transistor in the linear amplifying region for zero gain, a plurality of input signal sources, and means coupled to said second transistor electrodes for energizing said second transistor to provide a low alternating-current impedance relative to said emitter impedance means in shunt with said emitter impedance means to increase the gain of said first transistor from zero to a higher value in a single discrete step to selectively gate a signal from one of said sources without altering the biasing of said first transistor.

References Cited in the file of this patent

UNITED STATES PATENTS

| | | |
|---|---|---|
| 2,544,340 | Maxwell | Mar. 6, 1951 |
| 2,889,537 | Elliott | June 2, 1959 |
| 3,019,396 | Heine et al. | Jan. 30, 1962 |

FOREIGN PATENTS

| | | |
|---|---|---|
| 807,815 | Great Britain | Jan. 21, 1959 |